United States Patent
Hirose

(10) Patent No.: US 7,253,457 B2
(45) Date of Patent: Aug. 7, 2007

(54) SEMICONDUCTOR DEVICE WITH EXTERNAL TERMINALS ARRANGED SYMMETRICALLY WITH RESPECT TO A NORMAL EXTERNAL TERMINAL ARRANGEMENT

(75) Inventor: Yukitoshi Hirose, Tokyo (JP)

(73) Assignee: Elpida Memory, Inc. (JP)

( * ) Notice: Subject to any disclaimer, the term of this patent is extended or adjusted under 35 U.S.C. 154(b) by 0 days.

(21) Appl. No.: 10/217,094

(22) Filed: Aug. 12, 2002

(65) Prior Publication Data
US 2003/0038350 A1 Feb. 27, 2003

(30) Foreign Application Priority Data
Aug. 20, 2001 (JP) ............................. 2001-248920

(51) Int. Cl.
*H01L 27/10* (2006.01)
(52) U.S. Cl. .................. 257/203; 327/407; 327/408
(58) Field of Classification Search .............. 257/666, 257/738, 203, 907, 908, 776, 296, 401, 202, 257/207, 208, 209, 909, 681, 165, 166, 693, 257/786, 778; 327/407, 408
See application file for complete search history.

(56) References Cited

U.S. PATENT DOCUMENTS

| | | | |
|---|---|---|---|
| 5,512,783 A * | 4/1996 | Wakefield et al. .......... 257/693 |
| 5,805,520 A | 9/1998 | Anglada et al. ....... 365/230.02 |
| 6,242,800 B1 * | 6/2001 | Munos et al. ................ 257/712 |
| 6,417,718 B1 * | 7/2002 | Ota ............................ 327/407 |
| 2002/0113640 A1 * | 8/2002 | Jenkins ....................... 327/408 |
| 2003/0006821 A1 * | 1/2003 | Rogenmoser et al. ....... 327/408 |

FOREIGN PATENT DOCUMENTS

| | | |
|---|---|---|
| JP | 05-251495 | 9/1993 |
| JP | 07-086526 | 3/1995 |
| JP | 07-288282 | * 10/1995 |
| JP | 08-186227 | 7/1996 |
| JP | 11-053880 | 2/1999 |

* cited by examiner

*Primary Examiner*—Evan Pert
*Assistant Examiner*—Tan Tran
(74) *Attorney, Agent, or Firm*—Hayes Soloway P.C.

(57) ABSTRACT

A semiconductor device, which may be changed to a mirror package after the assembly without having to reinstall bonding wires, comprises: a plurality of fixed external terminals which include a power supply external terminal and a ground potential external terminal and which are arranged symmetrically in fixed positions; a plurality of variable external terminals of different types which are arranged symmetrically; a plurality of reverse-polarity selection external terminals which are symmetrically arranged in fixed positions, and a signal switching circuit which switches the arrangement of the symmetrically arranged variable external terminal according to the setting of the selection terminal.

24 Claims, 10 Drawing Sheets

SEMICONDUCTOR DEVICE WITH EXTERNAL TERMINALS ARRANGED SYMMETRICALLY WITH RESPECT TO A NORMAL EXTERNAL TERMINAL ARRANGEMENT

FIELD OF THE INVENTION

The present invention relates to a semiconductor device that has external terminals arranged symmetrically with respect to a normal external terminal arrangement.

BACKGROUND OF THE INVENTION

Computer storage devices contain semiconductor devices such as DRAM. Recently, the capacity of a storage device becomes larger and larger and much effort has been made to develop the technology for increasing the capacity.

The technology for mounting semiconductor devices on both sides of a board is effective for increasing the capacity of a storage device. In addition, mounting a semiconductor device with a normal external terminal arrangement (hereinafter termed a normal package) on one side of a board and mounting a semiconductor device with an arrangement where the external terminals are arranged laterally or vertically symmetrical to those of a normal package (hereinafter termed a mirror package) in the corresponding position of the other side of the board increase the wiring efficiency of the board. This is because mounting a normal package and a mirror package in the corresponding positions on the both sides of a board allows their pins to be directly connected through via holes. This eliminates the need for creating patterns on the board. Similarly, in a semiconductor module including a plurality of semiconductor devices, mounting a normal package mounted on one side of a board with a mirror package on the other would increase wiring efficiency. In the present specification, external pins are laterally symmetrical, if they are arranged symmetrically or bilaterally in left and light sides of a package and external pins are vertically symmetrical, if they are arranged symmetrically in upper and lower sides of the package.

Conventionally, a mirror package is generally manufactured during the assembly process by replacing a wire between an external terminal (hereinafter termed a package pin or simply pin) and a semiconductor chip pad (hereinafter termed chip pads or simply pads) or by replacing a bonding wire connected to the chip pad. Recently, however, it is required that a normal package be changed to a mirror package after the assembly process.

Japanese Patent Kokai Publication JP-A-7-288282 discloses a semiconductor device with a pad switching circuit that selectively changes the pad functions to allow the pins to be switched after the assembly process. According to the semiconductor device disclosed in Japanese Patent Kokai Publication JP-A-7-288282, the signal pins are switched by the pad switching circuit, and the power supply voltage pin and ground pin are switched by reinstalling the bonding wires, to build a mirror package. This increases the wiring efficiency of the board.

SUMMARY OF THE DISCLOSURE

According to the semiconductor device disclosed in Japanese Patent Kokai Publication JP-A-7-288282, the signal pins may be switched by the pad switching circuit even after the assembly process. However, to switch the power supply voltage pin and the ground pin that cannot be switched by the pad switching circuit, the bonding wires must be reinstalled. Therefore, on the semiconductor device disclosed in Japanese Patent Kokai Publication JP-A-7-288282, the power supply voltage pin and the ground pin cannot be switched after the assembly process.

Another problem is that, because the semiconductor device disclosed in Japanese Patent Kokai Publication JP-A-7-288282 has all signal pins switched with the use of the pad switching circuit, the pad switching circuit takes up much space on the circuit. A still another problem with the semiconductor device disclosed in Japanese Patent Kokai Publication JP-A-7-288282 is that, as the number of pins increases in future and the pad pitch becomes narrower, it will be difficult to create a pad switching circuit in a pitch between pads.

It is an object of the present invention to provide a semiconductor device that may be changed to a mirror package after the assembly process without having to reinstall the bonding wires.

The above and other objects of the invention are attained by a semiconductor in accordance with one aspect of the present invention, comprising: a plurality of fixed external terminals arranged symmetrically each other in fixed positions; a plurality of different types of variable external terminals arranged symmetrically each other; a plurality of selection external terminals arranged symmetrically each other in fixed position and set up to have reverse polarity each other; and a signal switching circuit that switches an arrangement of the variable external terminals arranged symmetrically each other according to a setting of the selection external terminals.

In accordance with the present invention, the fixed external terminals are arranged symmetrically, reverse-logic selection external terminals are arranged symmetrically, and the signal switching circuit switches the variable external terminals symmetrically based on the setting of the selection external terminals. When the semiconductor devices in this embodiment are mounted on both sides of a board, the reverse-logic selection terminals are opposed. Thus, by setting up the opposed selection external terminals in the same way, the same variable external terminals are opposed each other.

In accordance with one embodiment of the present invention, the fixed external terminals are arranged in laterally symmetrical positions each other, the variable external terminals are arranged in laterally symmetrical positions each other, and the selection external terminals are arranged in laterally symmetrical positions.

In accordance with another embodiment of the present invention, the fixed external terminals are arranged in vertically symmetrical positions each other, the variable external terminals are arranged in vertically symmetrical positions each other, and the selection external terminals are arranged in vertically symmetrical positions.

A semiconductor device in accordance with another aspect of the present invention comprises: a plurality of fixed external terminals arranged symmetrically each other in fixed positions; a plurality of different types of variable external terminals arranged symmetrically each other; and a signal switching circuit that switches an arrangement of the variable external terminals arranged symmetrically each other based on an internal signal indicating a selection of the device.

In accordance with the another aspect of the present invention, because the signal switching circuit performs selection based on the internal signal indicating the selection of the device, a normal package or a mirror package is selected when the device is selected even when the setting is not specified via the external terminals.

In one embodiment of the present invention, the fixed external terminals are arranged in laterally symmetrical positions each other and the variable external terminals are arranged in laterally symmetrical positions each other.

In another embodiment of the present invention, the fixed external terminals are arranged in vertically symmetrical positions each other and the variable external terminals are arranged in vertically symmetrical positions each other.

In one embodiment of the present invention, the fixed external terminals comprise first fixed external terminals and second fixed external terminals, the first fixed external terminals not being able to be switched by the signal switching circuit and being the same type of external terminals arranged symmetrically each other, the second fixed external terminals being usable each other for corresponding terminals symmetrically arranged.

As a result, the signal switching circuit switches only the external terminals that must be switched, but not the symmetrically arranged external terminals usable for the signals of the corresponding terminals. This configuration makes the signal switching circuit smaller.

In one embodiment of the present invention, the first fixed external terminals comprise an external terminal which is fed with a power supply voltage and an external terminal which is fed with a ground potential.

In one embodiment of the present invention, the second fixed external terminals comprise external terminals for data signals of a memory.

In one embodiment of the present invention, the signal switching circuit is provided inside a command decoder that analyzes a plurality of control signals.

Accordingly, the signal switching circuit, which is inside the command decoder, need not be arranged near a pad or a receiver.

In one embodiment of the present invention, the signal switching circuit is provided inside an address decoder that analyzes a plurality of address signals of a memory.

Accordingly, the signal switching circuit, which is inside the address decoder, need not be arranged near a pad or a receiver.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Embodiments of the present invention will now be described more in detail with reference to the drawings.

Figure 1:
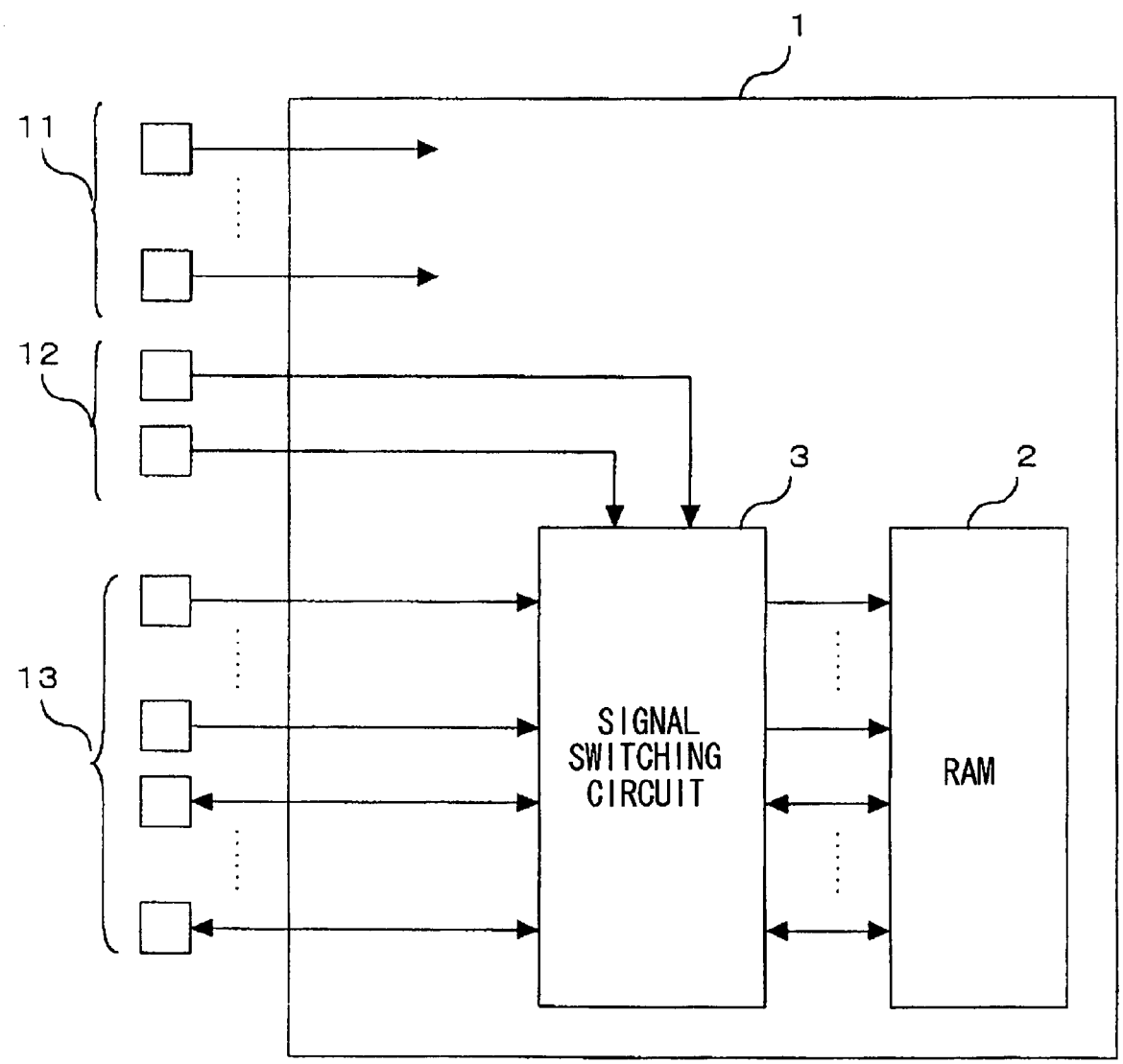
FIG. 1 is a block diagram showing the configuration of a RAM device in an embodiment of the present invention.

FIG. 1 is a block diagram showing the configuration of a RAM device in accordance with an embodiment of the present invention. Referring to FIG. 1, a RAM device 1 according to this embodiment comprises a RAM 2 and a signal switching circuit 3.

The RAM device 1 include , as external terminals, plurality of fixed pins 11, plurality of selection pins 12, and plurality of signal pins 13.

The fixed pins 11 include a power supply pin that supplies power to the whole RAM device 1, a ground pin that supplies a ground potential to the RAM device 1, and a reference voltage pin that supplies a reference voltage, used to read or write data, from or to the RAM device 1. The fixed pins 11 cannot be switched by the signal switching circuit 3.

The selection pins 12 are external terminals used to set up the signal switching circuit 3 whether or not the signal pins 13 are to be switched. The RAM device 1 becomes a normal package or a mirror package depending upon the signal level of the selection pins 12. A normal package is a semiconductor device which has a normal arrangement of external terminals. A mirror package is a semiconductor device on which the arrangement of external terminals is symmetrical, either laterally or vertically, with regard to those on a normal package. In this embodiment, the arrangement of the external terminals is laterally symmetrical unless otherwise stated.

The signal pins 13 are external terminals through which the RAM device 1 receives the address signal, data signal, bus control signal, and so on. The symmetrically arranged signal pins 13 are composed of paired pins.

The RAM 2 is a memory, such as a dynamic RAM, to or from which data is randomly written or read.

The signal switching circuit 3 switches the connection of symmetrically arranged signal pins 13 to the RAM 2 according to the setting indicated by the voltage level of the selection pins 12.

Figure 2:
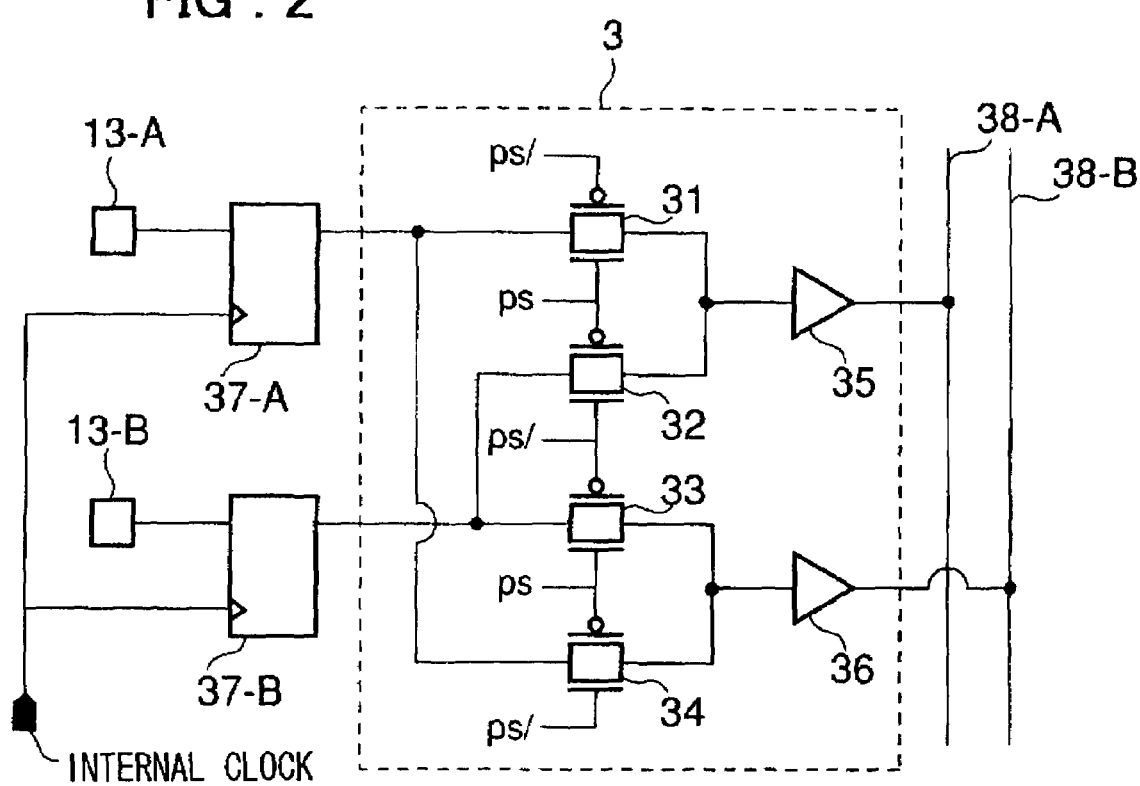
FIG. 2 is a general circuit diagram showing the configuration of a signal switching circuit.

FIG. 2 is a general circuit diagram illustrating the configuration of the signal switching circuit 3. Although only the circuit for switching one pair of signal pins 13 is shown in FIG. 2, the signal switching circuit 3 includes, in practice, a plurality of circuits each having the configuration shown in FIG. 2.

Referring to FIG. 2, the signal switching circuit 3 comprises transfer gates 31, 32, 33, and 34 and buffers 35 and 36.

The transfer gates 31, 32, 33, and 34 are complementary transfer gates composed of PMOS transistors and NMOS transistors.

The signal entered from a signal pin 13-A is received, via a pad, by a receiver 37-A that is a signal reception flip-flop, and the output from the receiver 37-A is supplied to the transfer gates 31 and 34 of the signal switching circuit 3. A receiver 37-B receives the signal entered from a signal pin 13-B, via a pad, and the output from the receiver 37-B is supplied to the transfer gates 32 and 33 of the signal switching circuit 3. Note that the receiver 37-A and the receiver 37-B are omitted in FIG. 1.

The signal switching circuit 3 receives selection signals ps and ps/ from the selection pins 12. The selection signal ps and the selection signal ps/ are reverse-polarity(complementary) signals; that is, when one of them is at a power supply level, the other is at a ground level.

The selection signal ps is supplied in common to the gate terminals of the NMOS transistors of the transfer gates 31 and 33, and to the gate terminals of the PMOS transistors of the transfer gates 32 and 34. The selection signal ps/ is supplied in common to the gate terminals of the PMOS transistors of the transfer gates 31 and 33, and to the gate terminals of the NMOS transistors of the transfer gates 32 and 34.

Therefore, the transfer gate 31 and the transfer gate 33 are turned on or off at the same time, and the transfer gate 32 and the transfer gate 34 are turned on or off at the same time. When the transfer gates 31 and 33 are on, the transfer gates 32 and 34 are off; when the transfer gates 31 and 33 are off, the transfer gates 32 and 34 are on.

When the selection signal ps is at the power supply voltage level and the selection signal ps/ is at the ground level, the transfer gates 31 and 33 are turned on and the transfer gates 32 and 34 are turned off. Therefore, the signal from the signal pin 13-A is output to an internal signal line 38-A, and the signal from the signal pin 13-B is output to an internal signal line 38-B.

On the other hand, when the selection signal ps is at the ground level and the selection signal ps/ is at the power supply voltage level, the transfer gates 32 and 34 are turned on and the transfer gates 31 and 33 are turned off. Therefore, the signal from the signal pin 13-A is output to the internal signal line 38-B, and the signal from the signal pin 13-B is output to the internal signal line 38-A.

Although the signal pins 13-A and 13-B are external terminals that receive input signals in this embodiment, those terminals may be output terminals signals for sending output signals or input/output terminals for receiving input signals and sending output signals. When the signal is an output signal, the direction of buffers 35 and 36 of the signal switching circuit 3 is opposite to that of the buffers shown in the figure; when the signal is an input/output signal, the buffers 35 and 35 in the signal switching circuit 3 are two-way buffers.

Figure 3:
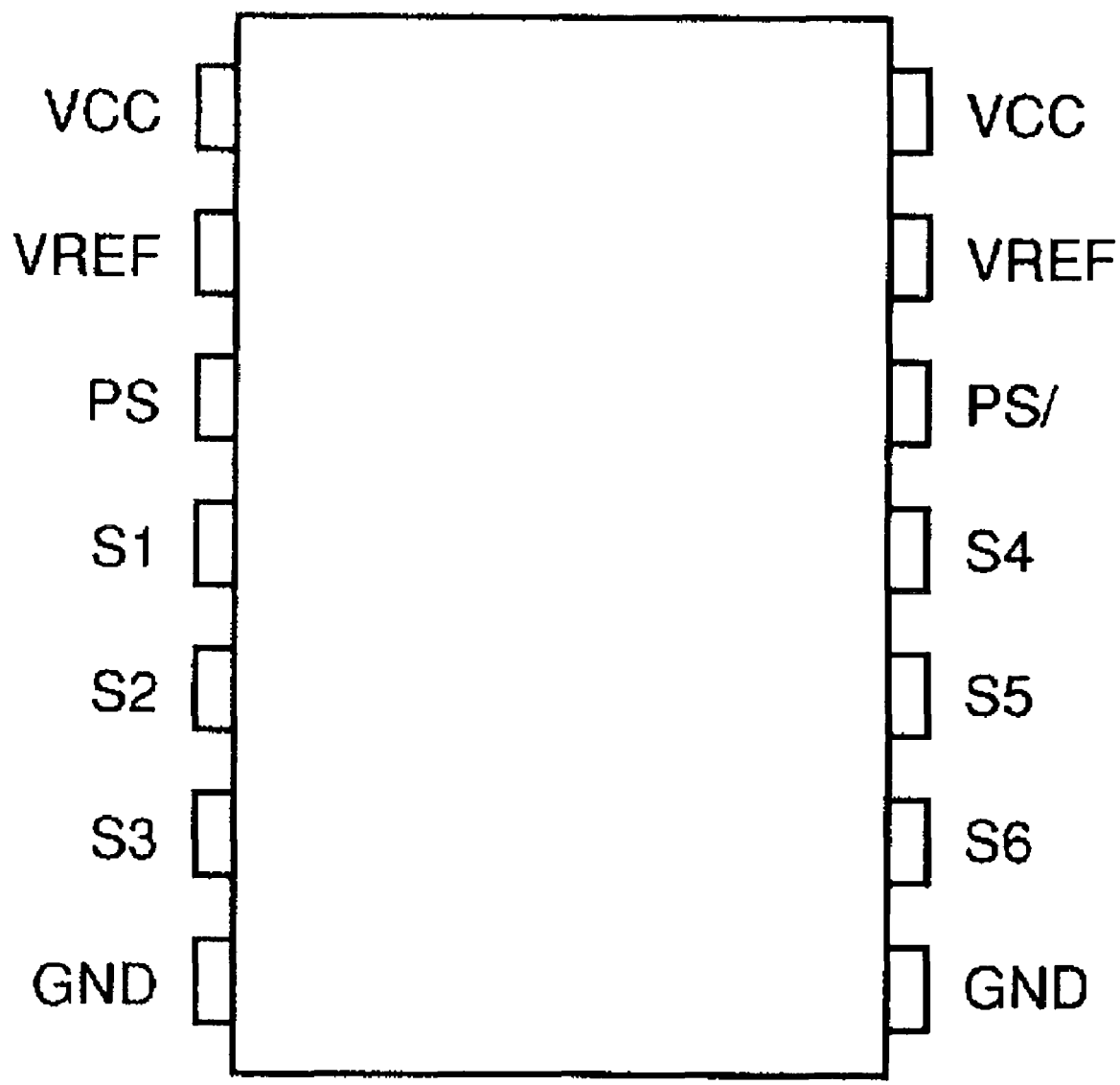
FIG. 3 is a diagram showing an example of pin arrangement of a RAM device set up for a normal package.

FIG. 3 is a diagram showing an example of the pin arrangement of a RAM device set up as a normal package. Referring to FIG. 3, the fixed pins, that is, the power supply pins VCC, reference voltage pins VREF, and ground pins GND, of the RAM device 1 in the normal package state are each symmetrically arranged, two for each. The selection pin PS and the selection pin PS/ are arranged symmetrically. A signal pin S1 and a signal pin S4 are arranged symmetrically and are paired. Similarly, a signal pin S2 and a signal pin S5, and a signal pin S3 and a signal pin S6, are each arranged symmetrically and are paired.

Figure 4:
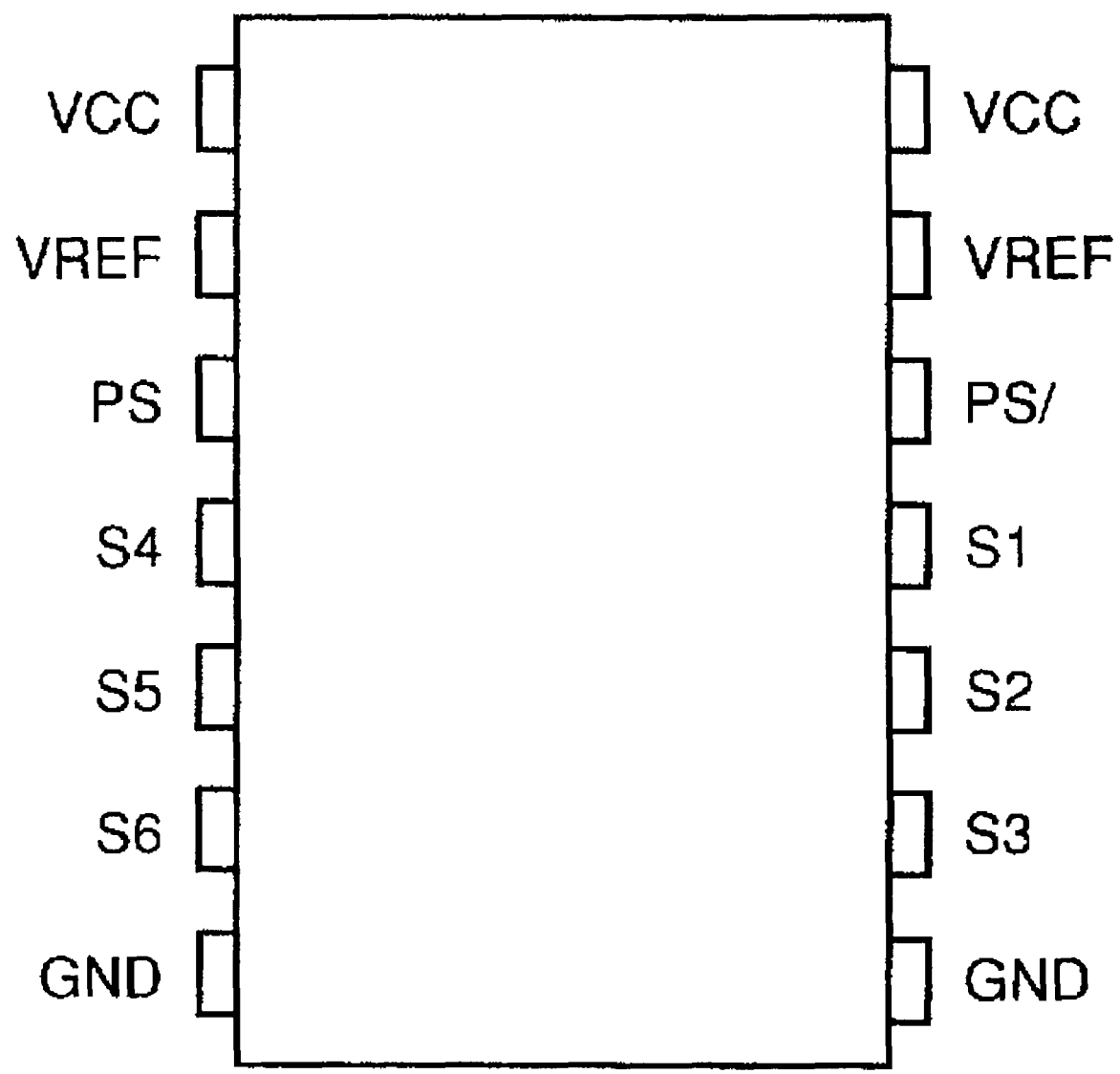
FIG. 4 is a diagram showing an example of pin arrangement of a RAM device set up for a mirror package.

FIG. 4 is a diagram showing an example of the pin arrangement of a RAM device set up as a mirror package. Referring to FIG. 4, the fixed pins, that is, the power supply pins VCC, reference voltage pins VREF, and ground pins GND, of the RAM device 1 in the mirror package state are each symmetrically arranged, two for each. The selection pin PS and the selection pin PS/ are arranged symmetrically. The signal pin S1 and the signal pin S4 are arranged symmetrically and are paired, but their arrangement is reverse to that in the normal package state. Similarly, the signal pin S2 and the signal pin S5, and the signal pin S3 and the signal pin S6, are each arranged symmetrically and are paired. The arrangement of the signal pins in the mirror package is reverse to that in the normal package state.

Figure 5:
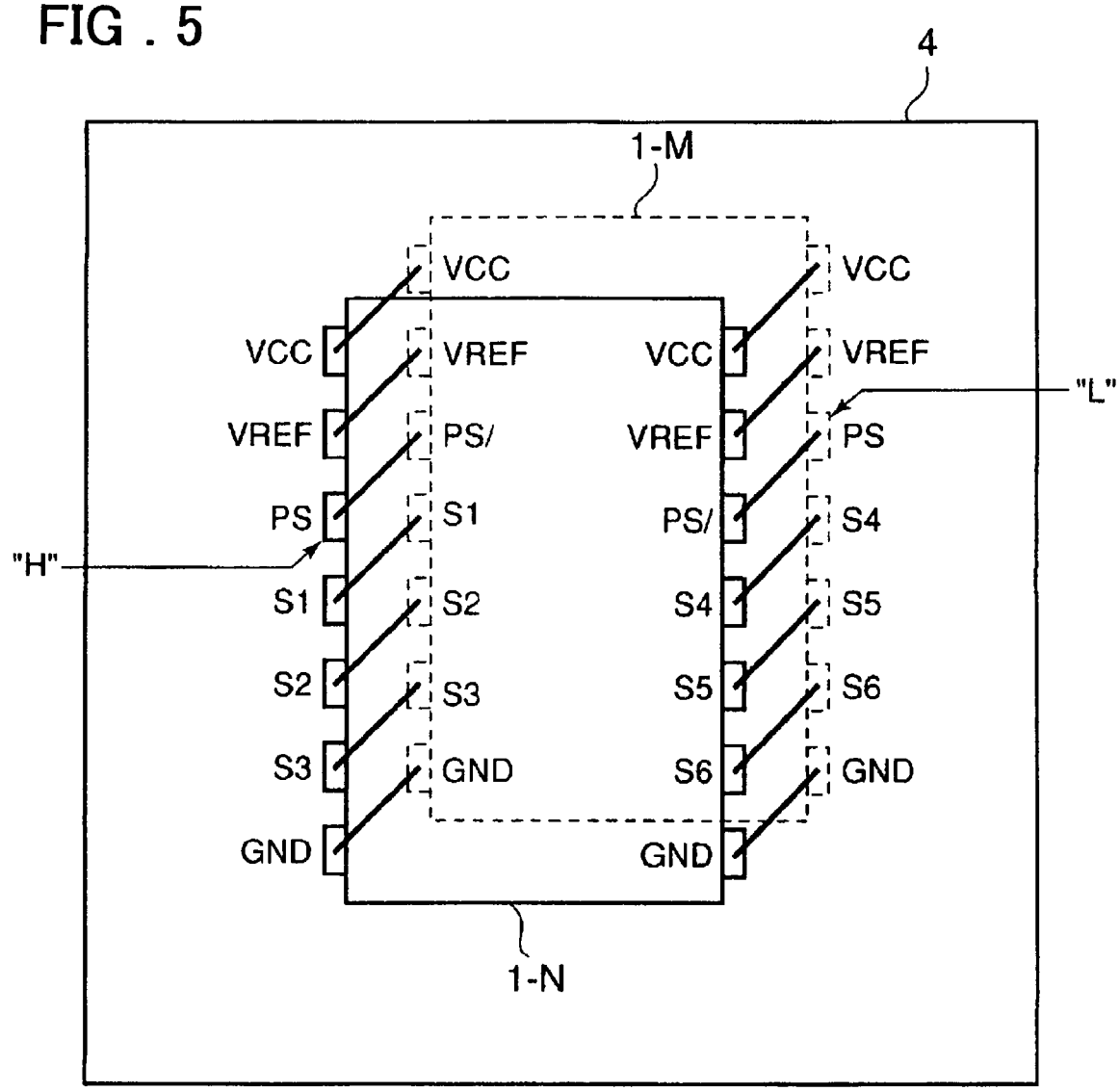
FIG. 5 is a diagram showing the structure of a semiconductor module in which the RAM devices in the embodiment are mounted in the corresponding positions on both sides of a board.

FIG. 5 is a figure showing the structure of a semiconductor module in which the RAM devices in this embodiment are mounted in the corresponding positions on both sides of a board. Referring to FIG. 5, RAM devices 1-N and 1-M are mounted in the opposed positions on both sides of a board 4.

The opposed external terminals of the RAM device 1-N and the RAM device 1-M are connected through via holes. The power supply voltage level ("H" in FIG. 5) is supplied to the selection pin PS of the RAM device 1-N and to the selection pin PS/ of the RAM device 1-M. The ground level ("L" in FIG. 5) is supplied to the selection pin PS/ of the RAM device 1-N and to the selection pin PS of the RAM device 1-M. Therefore, the RAM device 1-N is set up as a normal package, while the RAM device 1-M is set up as a mirror package.

Because the fixed pins, that is, the power supply pin VCC, reference voltage pin VREF, and ground pin GND, are arranged symmetrically, the same types of pins of the RAM device 1-N and the RAM device 1-M are in the opposed positions. Therefore, the pins may be directly connected through via holes.

The selection pin PS of the RAM device 1-N is connected to the selection pin PS/ of the RAM device 1-M, and the selection pin PS/ of the RAM device 1-N is connected to the selection pin PS of the RAM device 1-M. The logic of the selection pins PS and PS/ of a normal package is reverse to that of the selection pins of a mirror package. Therefore, this connection set up one of the packages as a normal package, and the other as a mirror package.

By setting up the selection pins PS and PS/ as described above, the opposed pins of the RAM device 1-N and the RAM device 1-M are used as the external terminals for the same signal.

The operation of the RAM device in the embodiment will be described.

Figure 6:
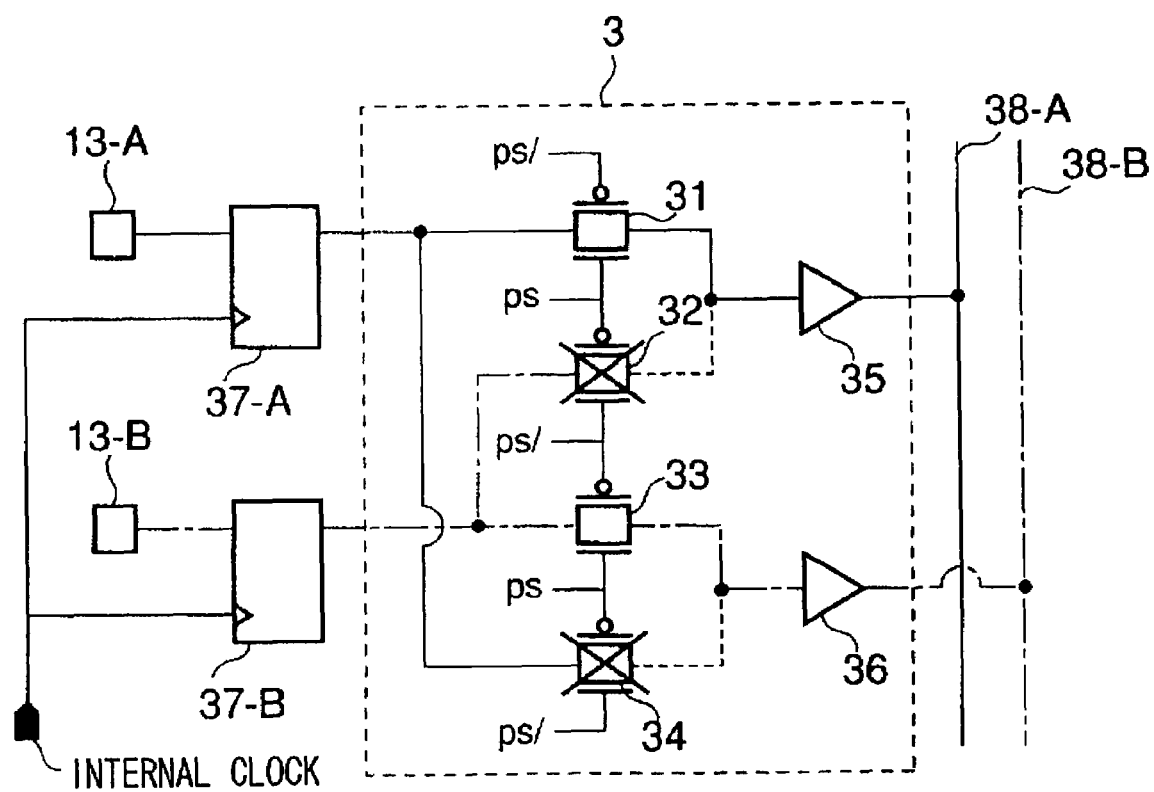
FIG. 6 is a diagram showing the operation of the RAM device in the embodiment in the normal package state.

FIG. 6 is a diagram showing the operation of the RAM device in this embodiment that is in the normal package state.

In order to place the RAM device 1 in the normal package state, the power supply level voltage is fed to the selection pin PS, and the ground level voltage is fed to the selection pin PS/. By setting up the selection pins PS and PS/ in this way, the transfer gates 31 and 33 are turned on and the transfer gates 32 and 34 are turned off. As a result, the signal sent from the signal pin 13-A is supplied to the buffer 35 via the transfer gate 31 to drive the internal signal line 38-A. The signal sent from the signal pin 13-B is supplied to the buffer 36 via the transfer gate 33 to drive the internal signal line 38-B.

Figure 7:
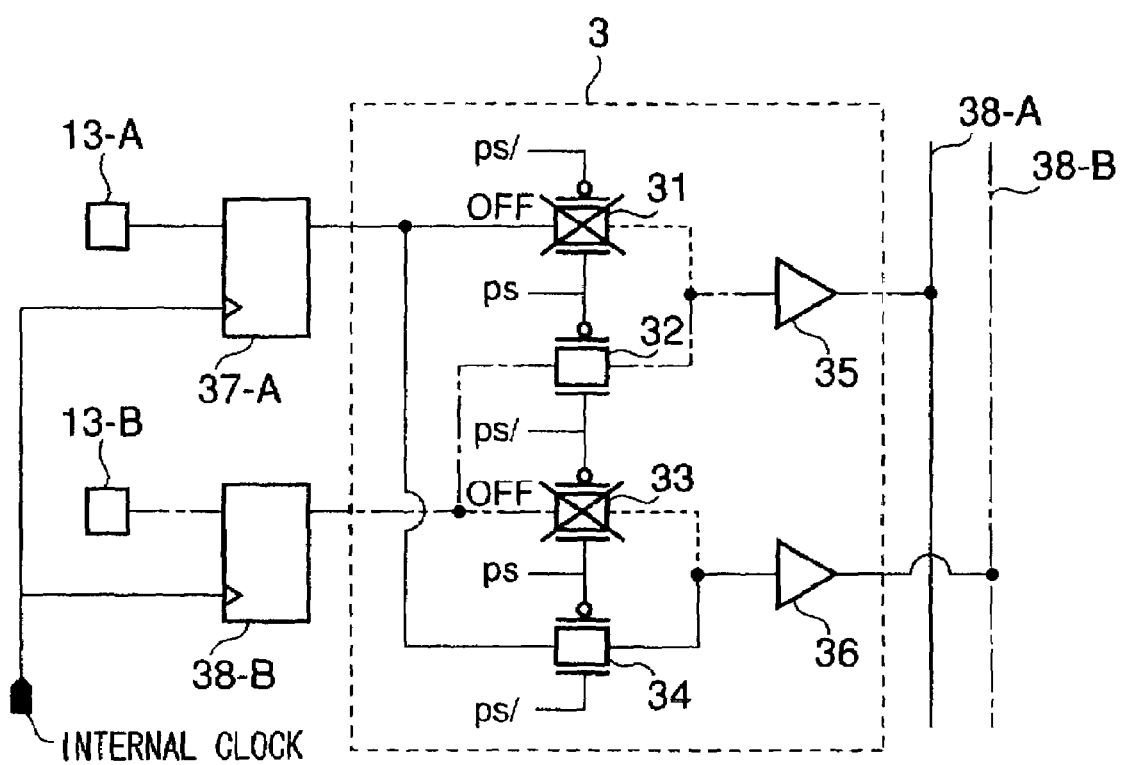
FIG. 7 is a diagram showing the operation of the RAM device in the embodiment in the mirror package state.

FIG. 7 is a diagram showing the operation of the RAM device in this embodiment that is in the mirror package state.

In order to place the RAM device 1 in the mirror package state, the ground level voltage is input to the selection pin PS, and the power supply level voltage to the selection pin PS/. By setting up the selection pins PS and PS/ in this way, the transfer gates 32 and 34 are turned on and the transfer gates 31 and 33 are turned off. Therefore, the signal sent from the signal pin 13-A is supplied to the buffer 36 via the transfer gate 34 to drive the internal signal line 38-B. The signal sent from the signal pin 13-B is supplied to the buffer 35 via the transfer gate 32 to drive the internal signal line 38-A.

The RAM device 1 in this embodiment, in which the same types of the fixed pins 11 are arranged symmetrically and the reverse-logic selection pins 12 are arranged symmetrically, can symmetrically switch the signal pins 13 according to the signal setup for the selection pins 12 through the signal switching circuit 3. This configuration makes it possible to select a normal package or a mirror package after the assembly process without having to reinstall the wiring or bonding wire between a ping and a pad during the assembly process.

Although the pin arrangement of the normal package and the pin arrangement of the mirror package are laterally symmetrical in this embodiment, the present invention is not limited to this arrangement but may be applied also to the vertically symmetrical arrangement.

A RAM device in accordance with another embodiment of the present invention will be described.

Figure 8:
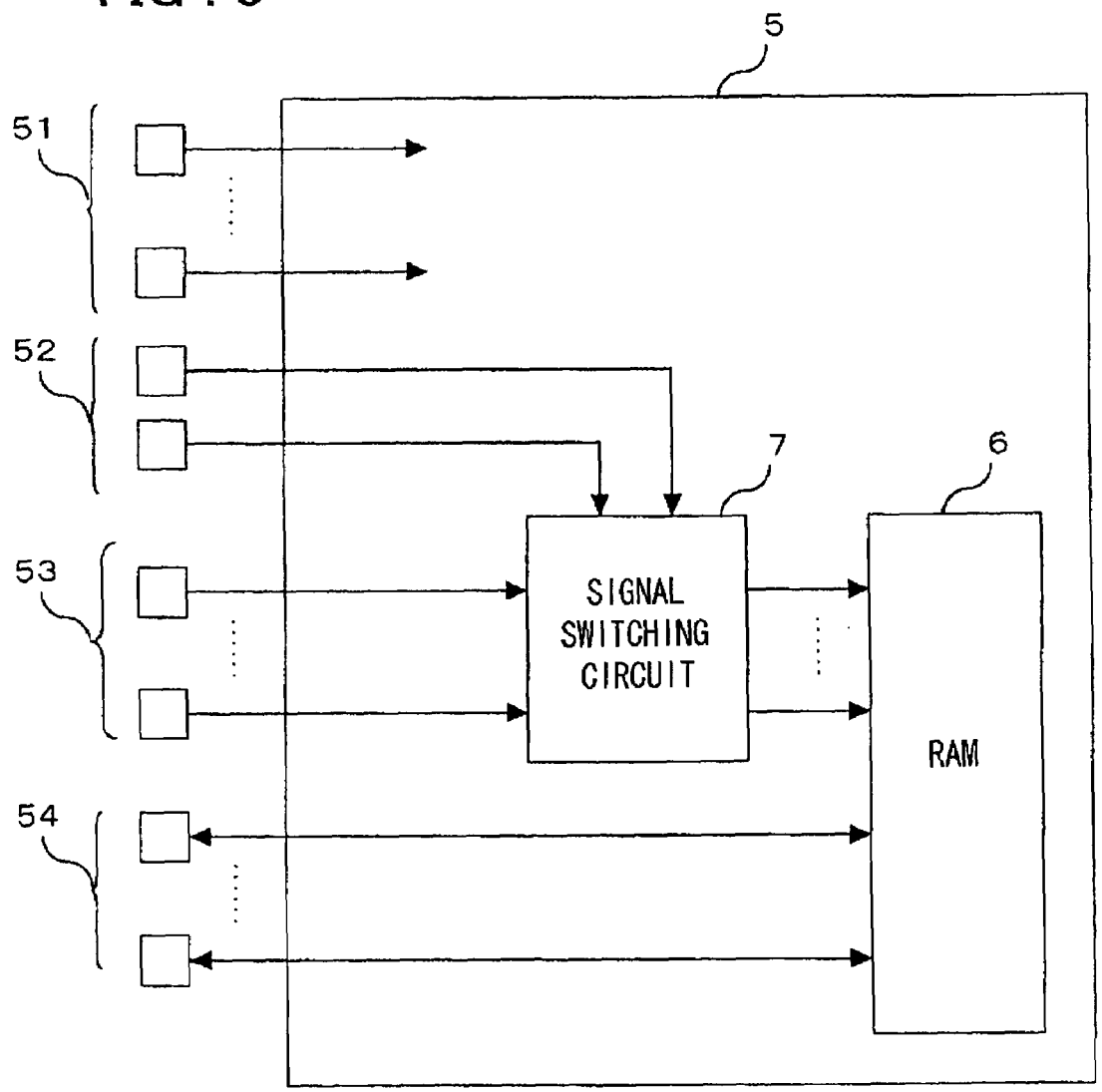
FIG. 8 is a block diagram showing the configuration of a RAM device in another embodiment of the present invention.

FIG. 8 is a block diagram showing the configuration of a RAM device in another embodiment of the present invention. Referring to FIG. 8, a RAM device 5 in another embodiment has a RAM 6 and a signal switching circuit 7.

The external terminals of the RAM device 5 include a plurality of fixed pins 51, a plurality of selection pins 52, a plurality of incompatible signal pins 53, and a plurality of compatible signal pins 54.

The fixed pins 51 include a power supply pin that supplies power to the whole RAM device 5, a ground pin that supplies ground voltage to the RAM device 5, and a reference voltage pin that supplies the RAM device 5 a reference voltage used to read/write data. The same type of fixed pins 51 is arranged symmetrically.

The selection pins 52 are external terminals used to set up the signal switching circuit 7 to determine whether or not the incompatible signal pins 53 are to be switched. The two reverse-logic selection pins 52 are arranged symmetrically. The RAM device 5 becomes a normal package or a mirror package depending upon the signal level of the selection pins 52.

The incompatible signal pins 53 are external terminals that supply the address signal, bus control signal, and so on to the RAM device 5. The symmetrically arranged incompatible signal pins 53 are paired. The incompatible signal pins 53 receive predetermined signals only.

The compatible signal pins 54 are external terminals into or from which data signals are input and output. The symmetrically arranged compatible signal pins 54 are paired. The reverse signals, if input to or output from the compatible signal pins 54 that are paired, do not affect system operation.

The RAM 6 is a memory, such as a dynamic RAM, to or from which data may be randomly written or read.

The signal switching circuit 7 switches the connection of the incompatible signal pins 53, which are symmetrically arranged and paired, to the RAM 6 according to the voltage level of the selection pins 52.

In the RAM device 5 in the embodiment shown in FIG. 8, the same type of fixed pins 51 are arranged symmetrically, the reserve-logic selection pins 52 are arranged symmetrically, and the compatible signal pins 54, which do not affect the system operation even if used for reverse signals, are arranged symmetrically. The signal switching circuit 7 is able to switch the incompatible signal pins 53 symmetrically according to the setup of the selection pins 52. Therefore, this configuration enables the package type, either a normal package or a mirror package, to be selected according to the setup of the selection pins 52 after the assembly process without having to reinstalling the wiring or bonding wires between pins and pads during assembly process.

In addition, in the RAM device 5 in the embodiment shown in FIG. 8, the signal switching circuit 7 symmetrically switches only the incompatible signal pins 53 that cannot be used for other signals, reducing the size of the signal switching circuit 7. The reduction in size allows the signal switching circuit 7 to be built in the RAM device 5 even if the number of pins increases in future and the pad pitch becomes narrower.

Although the pin arrangement of the normal package and that of the mirror package are laterally symmetrical in the embodiment shown in FIG. 8, the present invention is not limited to this arrangement but may be applied to the vertically symmetrical arrangement.

A RAM device in accordance with a further embodiment of the present invention will be described.

Figure 9:
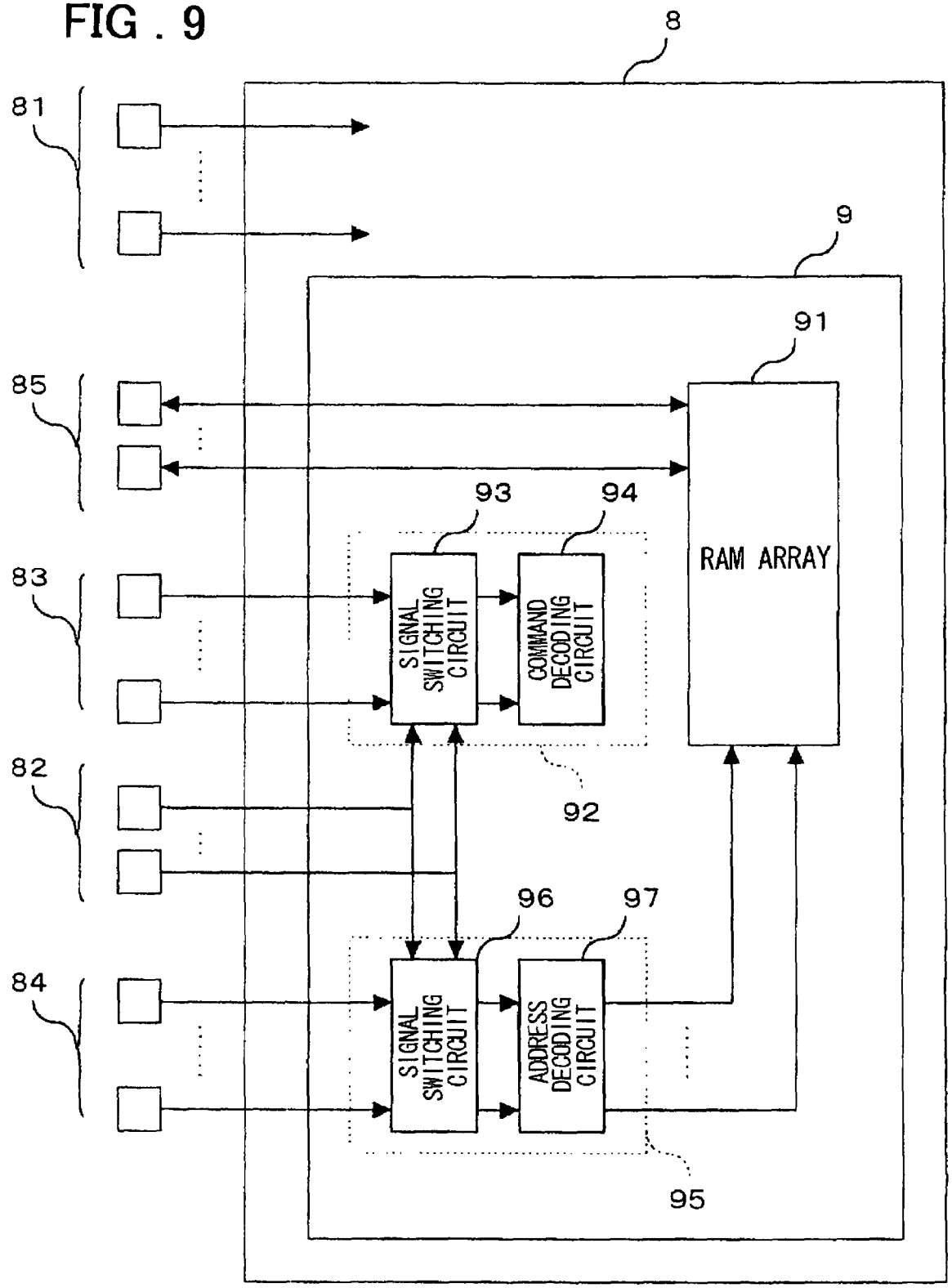
FIG. 9 is a block diagram showing the configuration of a RAM device in still another embodiment of the present invention.

FIG. 9 is a block diagram showing the configuration of a RAM device in a further embodiment of the present invention. Referring to FIG. 9, a RAM device 8 the still another embodiment of the present invention comprises a RAM 9 that, in turn, comprises a RAM array 91, a command decoder 92, and an address decoder 95.

The command decoder 92 comprises a signal switching circuit 93 and a command decoding circuit 94. The address decoder 95 comprises a signal switching circuit 96 and an address decoding circuit 97.

The external terminals of the RAM device 8 include fixed pins 81, selection pins 82, control pins 83, address pins 84, and data pins 85.

The fixed pins 81 are the same as the fixed pins 11 shown in FIG. 1.

The selection pins 82 are external terminals that set up the signal switching circuits 93 and 96 to determine whether the control pins 83 and the address pins 84 are to be switched. As with the selection pins 12 in FIG. 1, the two reverse-logic selection pins 82 are arranged symmetrically. The RAM device 8 becomes a normal package or a mirror package according to the signal level of the selection pins.

The control pins 83 are external pins that supply bus control signals and so on to the RAM device 8. The control pins 83, which are symmetrically arranged, are paired. The control pins 83 receive predetermined signals only.

The address pins 84 are external terminals that supply address signals to the RAM device 8. The address pins 84, which are symmetrically arranged, are paired. The address pins 84 receive predetermined address signals only.

The data pins 85 are external terminals that supply data signals to the RAM device 8. The data pins 85, which are symmetrically arranged, are paired. Even if the input and output of the paired data pins 85 are reversed, the system operation is not affected.

The RAM 9 is a memory such as a dynamic RAM to or from which data may be randomly written or read. The RAM array 91 is the memory array of the RAM 9.

The signal switching circuits 93 and 96 are the same as those in FIG. 2.

The command decoding circuit 94 analyzes signals from the control pins 83 to generate timing signals for use in accessing the RAM array 91.

The address decoding circuit 97 analyzes signals from the address pins 84 and generates addresses for use in accessing the RAM array 91.

In the RAM device 8 shown in FIG. 9, the signal switching circuit 93 is included in the command decoder 92 and the signal switching circuit 96 is included in the address decoder 95. This means that those circuits need not be near the pads or receivers (not shown) and that, even if the number of pins increases in future and the pad pitch becomes narrower, the signal switching circuits 93 and 96 may be created easily.

In addition, in the RAM device 8 in FIG. 9, only the control pins 83 and the address pins 84, which are required to be switched, are switched symmetrically, the sizes of the signal switching circuits 93 and 96 may be reduced.

Although the pin arrangement of the two reverse-logic selection pins is laterally symmetrical FIGS. 1, 8, and 9, the present invention is not limited to this arrangement but may be applied also to the vertically symmetrical arrangement.

Figure 10:
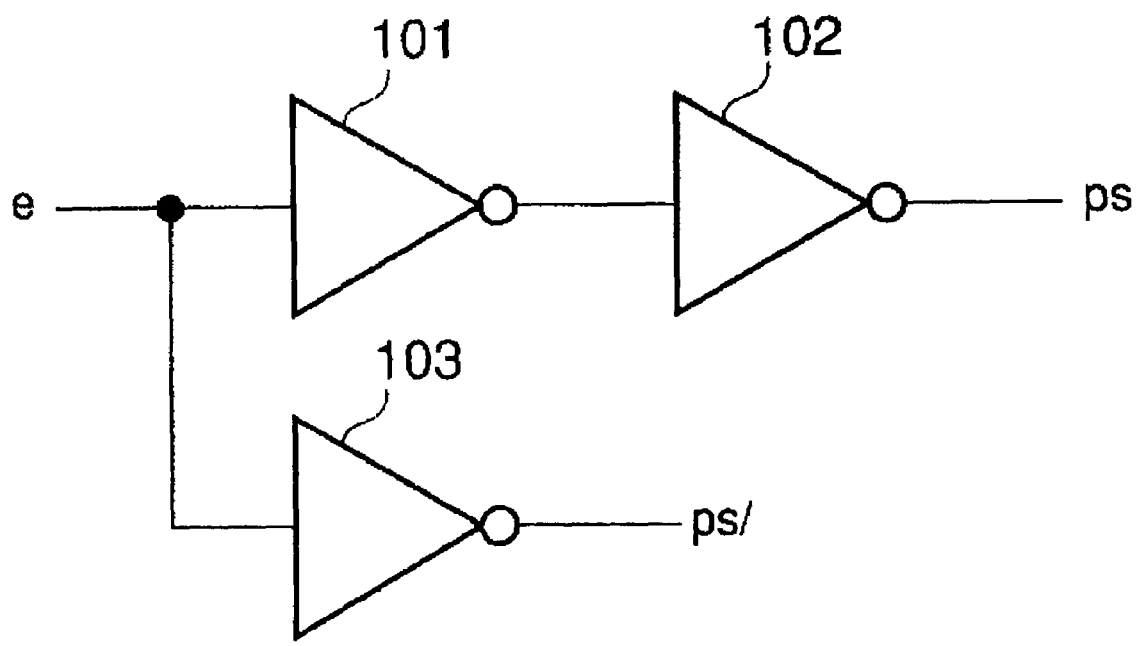
FIG. 10 is a circuit diagram showing a circuit that generates selection signals from the internal signals of the RAM device.

FIG. 10 is a circuit diagram of the circuit that generates the selection signals from the signals generated in the RAM device. Referring to FIG. 10, the selection signals ps and ps/ are generated from the internal signal e by inverters 101, 102, and 103.

Table 1 lists an example of selection states of the RAM device. Referring to Table 1, for the RAM device mounted on the component side of the board, the internal signal e is "H", the selection signal ps is "H", and the selection signal ps/ is "L". For the RAM device mounted on the wiring side of the board, the internal signal e is "L", the selection signal ps is "L", and the selection signal ps/ is "H".

TABLE 1

| Board side | Internal signal e | Selection signal ps | Selection signal ps/ | Package state |
|---|---|---|---|---|
| Component side | "H" | "H" | "L" | Normal |
| Wiring side | "L" | "L" | "H" | Mirror |

The address signal, command signal, and so on, which are used to select the RAM device, may be used as the internal signals. Using those pins eliminates the need for the selection pins and makes more external terminals available for other signals.

The meritorious effects of the present invention are summarized as follows.

According to the present invention, the fixed external terminals are arranged symmetrically, the reverse-logic selection external terminals are arranged symmetrically, and the signal switching circuit switches variable external terminals symmetrically according to the setting specified by the selection external terminals. On a board where RAM devices are mounted on its both sides, the reverse-logic selection external terminals are opposed. As a result, setting up the opposed selection external terminals in the same manner allows the same types of variable external terminals to be opposed. This arrangement makes it possible to easily oppose a normal package against a mirror package after the assembly, thus eliminating the need for reinstalling the wiring or bonding wires between a pin and a pad in the assembly process.

In addition, because the symmetrically arranged external terminals, each usable for the corresponding terminal, need not be rearranged but the signal switching circuit switches only the external terminals that must be switched, the size of the signal switching circuit is reduced, as a result of which, the signal switching circuit may be arranged easily.

The signal switching circuit, which is in the command decoder, need not be placed near a pad or a receiver and hence, even if the number of pins increases in future and the pad pitch becomes narrower, the signal switching circuit may be manufactured easily.

The signal switching circuit, which is in the address decoder, need not be placed near a pad or a receiver and hence, even if the number of pins increases in future and the pad pitch becomes narrower, the signal switching circuit may be manufactured easily.

According to another semiconductor according to the present invention, the internal signal for selecting the device is used for selecting the signal switching circuit. Thus, when the device is selected, a normal package or a mirror package is selected with no need to set up the external terminals. The configuration of this semiconductor eliminates the need for selection external terminals and makes the external terminals available for other signals.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items might fall under the modifications aforementioned.

What is claimed is:

1. A semiconductor device comprising:
   at least three sets of separate and distinct external terminals, said sets of external terminals comprising:
      a plurality of fixed external terminals arranged symmetrically to each other in fixed positions;
      a plurality of variable external terminals being different types and arranged symmetrically to each other;
      a plurality of selection external terminals arranged symmetrically to each other in fixed positions and set up to have a reverse polarity to each other; and
   a signal switching circuit that switches an arrangement of said variable external terminals arranged symmetrically to each other according to a setting of said selection external terminals,
   wherein said signal-switching circuit is provided inside a command decoder that analyzes a plurality of control signals.

2. The semiconductor device as defined in claim 1 wherein said fixed external terminals are arranged in laterally symmetrical positions to each other, said variable external terminals are arranged in laterally symmetrical positions to each other, and said selection external terminals are arranged in laterally symmetrical positions.

3. The semiconductor device as defined in claim 1 wherein said fixed external terminals are arranged in vertically symmetrical positions to each other, said variable external terminals are arranged in vertically symmetrical positions to each other, and said selection external terminals are arranged in vertically symmetrical positions.

4. The semiconductor device as defined in claim 1 wherein said fixed external terminals include a plurality of first fixed external terminals and a plurality of second fixed external terminals, said first fixed external terminals being unable to be switched by said signal switching circuit and being the same type of external terminals arranged symmetrically to each other, symmetrically arranged terminals of said second fixed external terminals being usable for an opposite signal.

5. The semiconductor device as defined in claim 4 wherein said first fixed external terminals include an external terminal for receiving a power supply voltage and an external terminal for receiving a ground potential.

6. The semiconductor device as defined in claim 4 wherein said second fixed external terminals include external terminals for data signals of a memory.

7. A semiconductor device comprising:
at least three sets of separate and distinct external terminals, said sets of external terminals comprising:
a plurality of fixed external terminals arranged symmetrically to each other in fixed positions;
a plurality of variable external terminals being different types and arranged symmetrically to each other;
a plurality of selection external terminals arranged symmetrically to each other in fixed positions and set up to have a reverse polarity to each other; and
a signal switching circuit that switches an arrangement of said variable external terminals arranged symmetrically to each other according to a setting of said selection external terminals,
wherein said signal-switching circuit is provided inside an address decoder that analyzes a plurality of address signals of a memory.

8. The semiconductor device as defined in claim 7 wherein said fixed external terminals are arranged in laterally symmetrical positions to each other, said variable external terminals are arranged in laterally symmetrical positions to each other, and said selection external terminals are arranged in laterally symmetrical positions.

9. The semiconductor device as defined in claim 7 wherein said fixed external terminals are arranged in vertically symmetrical positions to each other, said variable external terminals are arranged in vertically symmetrical positions to each other, and said selection external terminals are arranged in vertically symmetrical positions.

10. The semiconductor device as defined in claim 7 wherein said fixed external terminals include a plurality of first fixed external terminals and a plurality of second fixed external terminals, said first fixed external terminals being unable to be switched by said signal switching circuit and being the same type of external terminals arranged symmetrically to each other, symmetrically arranged terminals of said second fixed external terminals being usable for an opposite signal.

11. The semiconductor device as defined in claim 10 wherein said first fixed external terminals include an external terminal for receiving a power supply voltage and an external terminal for receiving a ground potential.

12. The semiconductor device as defined in claim 10 wherein said second fixed external terminals include external terminals for data signals of a memory.

13. A semiconductor device comprising:
at least two sets of separate and distinct external terminals, said sets of external terminals comprising:
a plurality of fixed external terminals arranged symmetrically to each other in fixed positions;
a plurality of variable external terminals being different types and arranged symmetrically to each other; and
a signal switching circuit that switches an arrangement of said variable external terminals arranged symmetrically to each other on the basis of an internal signal indicating a section of the device,
wherein said signal-switching circuit is provided inside a command decoder that analyzes a plurality of control signals.

14. The semiconductor device as defined in claim 13 wherein said fixed external terminals are arranged in laterally symmetrical positions to each other and said variable external terminals are arranged in laterally symmetrical positions to each other.

15. The semiconductor device as defined in claim 13 wherein said fixed external terminals are arranged in vertically symmetrical positions to each other and said variable external terminals are arranged in vertically symmetrical positions to each other.

16. The semiconductor device as defined in claim 13 wherein said fixed external terminals include a plurality of first fixed external terminals and a plurality of second fixed external terminals, said first fixed external terminals being unable to be switched by said signal switching circuit and being the same type of external terminals arranged symmetrically to each other, symmetrically arranged terminals of said second fixed external terminals being usable for an opposite signal.

17. The semiconductor device as defined in claim 16 wherein said first fixed external terminals include an external terminal for receiving a power supply voltage and an external terminal for receiving a ground potential.

18. The semiconductor device as defined in claim 16 wherein said fixed external terminals include external terminals for data signals of a memory.

19. A semiconductor device comprising:
at least two sets of separate and distinct external terminals, said sets of external terminals comprising:
a plurality of fixed external terminals arranged symmetrically to each other in fixed positions;
a plurality of variable external terminals being different types and arranged symmetrically to each other; and
a signal switching circuit that switches an arrangement of said variable external terminals arranged symmetrically to each other on the basis of an internal signal indicating a selection of the device,
wherein said signal-switching circuit is provided inside an address decoder that analyzes a plurality of address signals of a memory.

20. The semiconductor device as defined in claim 19 wherein said fixed external terminals are arranged in laterally symmetrical positions to each other and said variable external terminals are arranged in laterally symmetrical positions to each other.

21. The semiconductor device as defined in claim 19 wherein said fixed external terminals are arranged in vertically symmetrical positions to each other and said variable external terminals are arranged in vertically symmetrical positions to each other.

22. The semiconductor device as defined in claim 19 wherein said fixed external terminals include a plurality of first fixed external terminals and a plurality of second fixed external terminals, said first fixed external terminals being unable to be switched by said signal switching circuit and being the same type of external terminals arranged symmetrically to each other, symmetrically arranged terminals of said second fixed external terminals being usable for an opposite signal.

23. The semiconductor device as defined in claim 22 wherein said first fixed external terminals include an external terminal for receiving a power supply voltage and an external terminal for receiving a ground potential.

24. The semiconductor device as defined in claim 22 wherein said fixed external terminals include external terminals fox data signals of a memory.

* * * * *

UNITED STATES PATENT AND TRADEMARK OFFICE
CERTIFICATE OF CORRECTION

| | |
|---|---|
| PATENT NO. | : 7,253,457 B2 |
| APPLICATION NO. | : 10/217094 |
| DATED | : August 7, 2007 |
| INVENTOR(S) | : Hirose |

It is certified that error appears in the above-identified patent and that said Letters Patent is hereby corrected as shown below:

Claim 24, Col. 14, line 3, "terminals fox data" should be -- terminals for data --.

Signed and Sealed this

Fourteenth Day of July, 2009

JOHN DOLL
*Acting Director of the United States Patent and Trademark Office*